(12) United States Patent
He et al.

(10) Patent No.: US 6,929,505 B2
(45) Date of Patent: Aug. 16, 2005

(54) ELECTRICAL CONNECTOR WITH RELIABLE RESILIENT BEAMS

(75) Inventors: Wen He, Kunsan (CN); Fujin Peng, Kunsan (CN); Nick Lin, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/912,811

(22) Filed: Aug. 6, 2004

(65) Prior Publication Data

US 2005/0032399 A1 Feb. 10, 2005

(30) Foreign Application Priority Data

Aug. 6, 2003 (TW) ...................................... 92214294 U

(51) Int. Cl.⁷ ................................................ H05K 1/00
(52) U.S. Cl. .......................... 439/526; 439/525; 439/70
(58) Field of Search .............................. 439/66, 70, 71, 439/526, 525

(56) References Cited

U.S. PATENT DOCUMENTS

| | | |
|---|---|---|
| 5,161,983 A | * 11/1992 | Ohno et al. ................. 439/71 |
| 5,713,744 A | 2/1998 | Lamb |
| 5,967,797 A | 10/1999 | Maldonado |
| 6,132,220 A | 10/2000 | McHugh et al. |
| 6,164,980 A | 12/2000 | Goodwin |
| 6,196,849 B1 | 3/2001 | Goodwin |

* cited by examiner

Primary Examiner—Briggitte R. Hammond
(74) Attorney, Agent, or Firm—Wei Te Chung

(57) ABSTRACT

An electrical connector (1) for connecting a land grid array (LGA) chip with a printed circuit board (PCB) includes a housing (10), and terminals (11) received in passageways (102) of the housing. The housing defines a base (100) and four sidewalls (12), the base and the sidewalls cooperatively defining a space therebetween for receiving the LGA chip. The base has a multiplicity of passageways along a length thereof, for receiving the corresponding terminals therein. Two adjacent sidewalls each define a resilient beam (13) with an incline surface and joining the sidewall at two ends. A space (15) is defined between the beam and the sidewall. When the LGA chip is placed on the base, the two resilient beams can resiliently act on the chip to ensure reliable engagement between the LGA chip and the connector.

10 Claims, 3 Drawing Sheets

ELECTRICAL CONNECTOR WITH RELIABLE RESILIENT BEAMS

BACKGROUND OF THE INVENTION

1. Field of the Invention

The present invention relates to an electrical connector for electrically connecting an electronic package such as a land grid array (LGA) chip with a circuit substrate such as a printed circuit board (PCB), and particularly to a connector with reliable resilient beams.

2. Description of the Prior Art

Land grid array (LGA) electrical connectors are widely used in the connector industry for electrically connecting LGA chips to printed circuit boards (PCBs) in personal computers (PCs). As described in "Nonlinear Analysis Helps Design LGA Connectors" (Connector Specifier, February 2001, pp. 18–20), the LGA connector mainly comprises an insulative housing and a multiplicity of terminals. The housing comprises a multiplicity of terminal passageways defined therein in a generally rectangular array, for interferentially receiving corresponding conductive terminals. Due to the very high density of the terminal array in a typical LGA chip, the LGA chip need to be precisely seated on the LGA connector to ensure reliable signal transmission between the terminals and the LGA chip. Means for accurately attaching the LGA chip to the LGA connector are disclosed in U.S. Pat. Nos. 5,967,797 and 6,132,220.

Referring to FIG. 3, a conventional connector 6 comprises a substantially rectangular housing 60 and a multiplicity of conductive terminals 62 received therein. The housing 60 comprises four raised sidewalls 61, and a flat base 63 disposed between the four raised sidewalls 62. The base 63 and the sidewalls 61 cooperatively define a space therebetween for receiving an LGA chip 7 therein. The base 63 defines a multiplicity of terminal passageways 630 for receiving the terminals 62 therein. A resilient first arm 611 extends from one sidewall 61 into the base 63. Two spaced resilient second arms 612 extend from one adjacent sidewall 61 into the base 63. Each of the first and second arms 611, 612 is cantilever from the inner face of the corresponding sidewalls 61. A first space 610 is defined between the first arm 611 and the sidewall 61, and a second space 613 is defined between the second arm 612 and the adjacent sidewall 61. The first and second arms 611, 612 can generate resilient in respective space. The first arm 611 defines a first incline surface 611A at a distal end thereof, and the second arm 612 defines a second incline surface 612A at a distal end thereof. The first and second incline surface 611A, 612A can guide the LGA chip 7 on the base 63 to engage the terminals 62 received in the base 63.

In assembly, when the LGA chip 7 is placed in the base 63 of the housing 60, the LGA chip 7 engages the first incline surface 611A of the first arm 611 and the second incline surfaces 612A of the second arms 612 before engaging with the first and second arms 611, 612. Then the first and second arms 611, 612 generate resilient forces in respective spaces 610, 613 to hold the LGA chip 7. Thus the first and second arms 611, 612 cooperatively secure the LGA chip 7 on the connector 1. As a result, mechanical and electrical engagement between the terminals 61 and corresponding leads (not shown) of the LGA chip 7 is attained.

However, when the LGA chip 7 is received in the base 63, with two sides of the LGA chip 7 always pressing the first and second arms 611, 612 respective, a counterforce respectively presses upon the inner sides of the first and the second arms 611, 612 of the housing 60 to make the first and second arms 611, 612 deform all the time. Because the first and second arms 611, 612 are cantilever structure and they connect the respective sidewalls 61 respective only one end. Thus, after using for a long time, the first and second arms 611, 612 will crack from their respective ends connecting the sidewalls 61. If this happens, the LGA chip 7 can not secure between the sidewalls 61 reliably, and some terminals 61 received in the base 63 may not fully engage with the corresponding leads of the LGA chip 7. Uniform engagement between the terminals 61 and the corresponding leads of the LGA chip 7 is destroyed, and even open electrical circuits are formed therebetween. Thus, reliability of mechanical and electrical engagement between the terminals 61 and the corresponding leads of the LGA chip 7 is decreased.

Therefore, a new electrical connector which overcomes the above-mentioned problems is desired.

SUMMARY OF THE INVENTION

An object of the present invention is to provide an electrical connector for electrically connecting an electronic package such as an LGA chip with a circuit substrate such as a PCB, whereby the electrical connector is configured to ensure reliable engagement between the electronic package and the connector.

Another object of the present invention is to provide an electrical connector configured so that securing beams the connector can accurately fasten the electronic package on the connector.

To achieve the above objects, an electrical connector in accordance with a preferred embodiment of the present invention is for connecting a land grid array (LGA) chip with a printed circuit board (PCB). The connector includes an insulative housing, and a multiplicity of conductive terminals received in the housing. The housing has four sidewalls and a flat base disposed between the sidewalls, the base and the sidewalls cooperatively defining a space therebetween for receiving the LGA chip therein. The base defines a multiplicity of passageways along a length thereof, for receiving the corresponding terminals therein. Two adjacent sidewalls respective define a resilient beam in their inner portions thereof. The beam has an incline surface and connects with two portions of the sidewall. With this configuration, when the LGA chip is received in the base and engages with the terminals, the resilient beam can accurately secure the LGA chip on the housing under the beam's elasticity. This ensures that engagement between the connector and the LGA chip is reliable.

Other objects, advantages and novel features of the invention will become more apparent from the following detailed description when taken in conjunction with the accompanying drawings, in which:

DESCRIPTION OF THE PREFERRED EMBODIMENT

Reference will now be made to the drawings to describe the present invention in detail.

Figure 1:
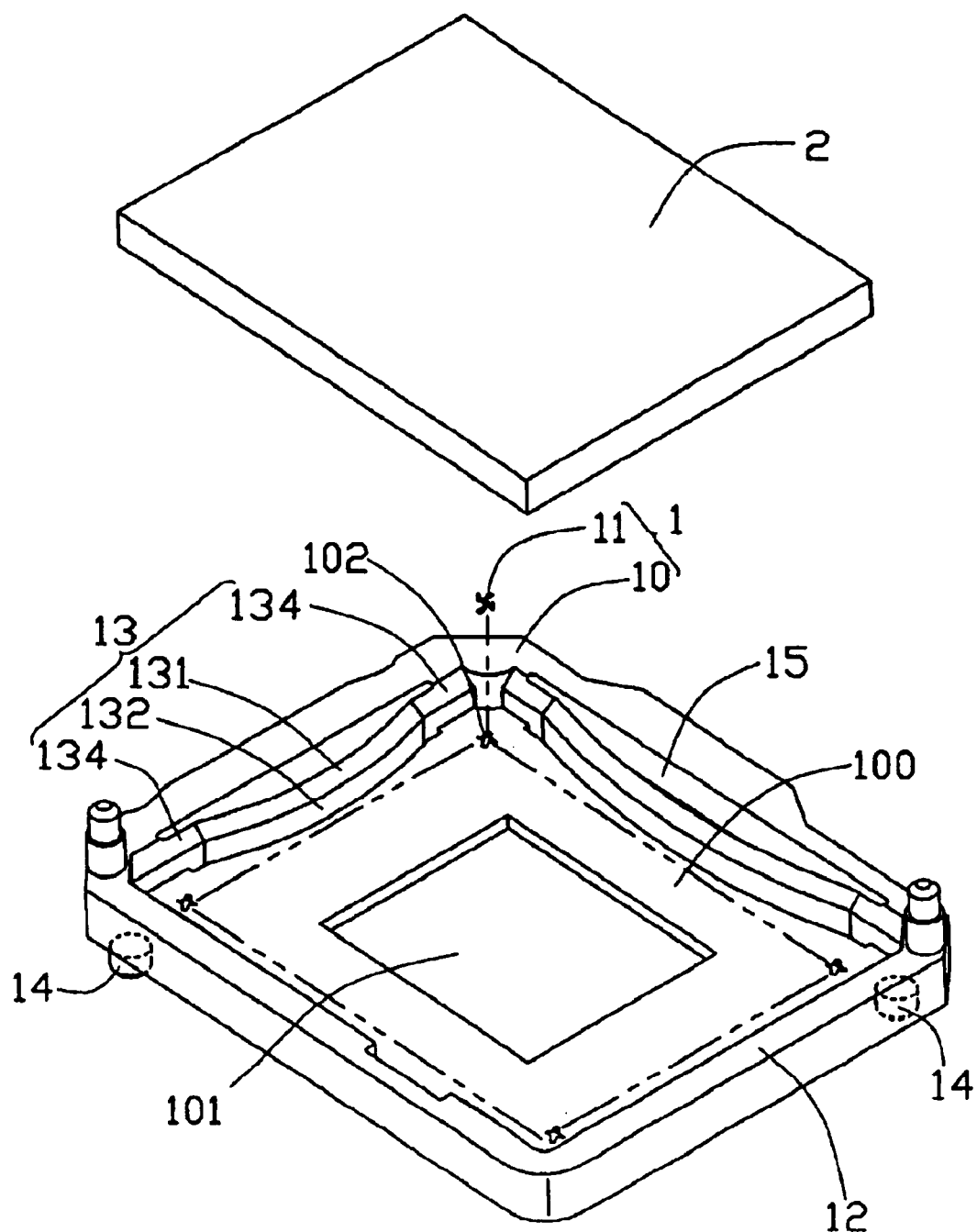
FIG. 1 is a simplified, exploded, isometric view of an LGA electrical connector in accordance with the preferred embodiment of the present invention, together with an LGA chip ready to be mounted in a base of the connector.

Referring to FIG. 1, an electrical connector 1 in accordance with the preferred embodiment of the present invention is used for electrically connecting an electronic package such as a land grid array (LGA) central processing unit (CPU) 2 with a circuit substrate such as a printed circuit board (PCB) (not shown). The LGA CPU 2 is hereinafter referred to as the LGA chip 2. The connector 1 comprises an insulative housing 10, and a multiplicity of conductive terminals 11 received in the housing 10.

The housing 10 is substantially rectangular, and is formed by molding. The housing 10 comprises four sidewalls 12, and a flat base 100 disposed between the sidewalls 12. The base 100 and the sidewalls 12 cooperatively define a space therebetween for receiving the LGA chip 2 therein. The base 100 defines a square central cavity 101 therein, and a multiplicity of terminal passageways 102 regularly arranged in a rectangular array around the cavity 101. The passageways 102 are for interferentially receiving corresponding terminals 11 therein. Two adjacent sidewalls 12 each define a resilient beam 13 extending from two portion of the sidewall 12. In addition, the beam 13 can elastically deform. Thus the LGA chip 2 can be guidably fixed between the beams 13 and the sidewalls 12. A space 15 is formed between the beam 13 and the sidewall 12, for the beau, 13 generating resilient. The beam 13 comprises an arcuate portion 132 at a top portion thereof, and two connecting portions 134 connecting two portions of the sidewall 12. The arcuate portion 132 is located in a middle of the sidewall 12 and protrudes into the space disposed between the base 100 and the sidewalls 12. The arcuate portion 132 defines an incline surface 131 slanting downwardly toward the space 15. Two alignment posts 14 are formed at a bottom face of the housing 10, for engagingly fixing the connector 1 on a PCB (not shown).

In use, the connector 1 is pre-positioned on the PCB, with the posts 14 of the connector 1 being received in the holes (not shown) of the PCB. The connector 1 is mounted on the PCB by using surface mount technology (SMT) or suitable mechanical tools.

Figure 2:
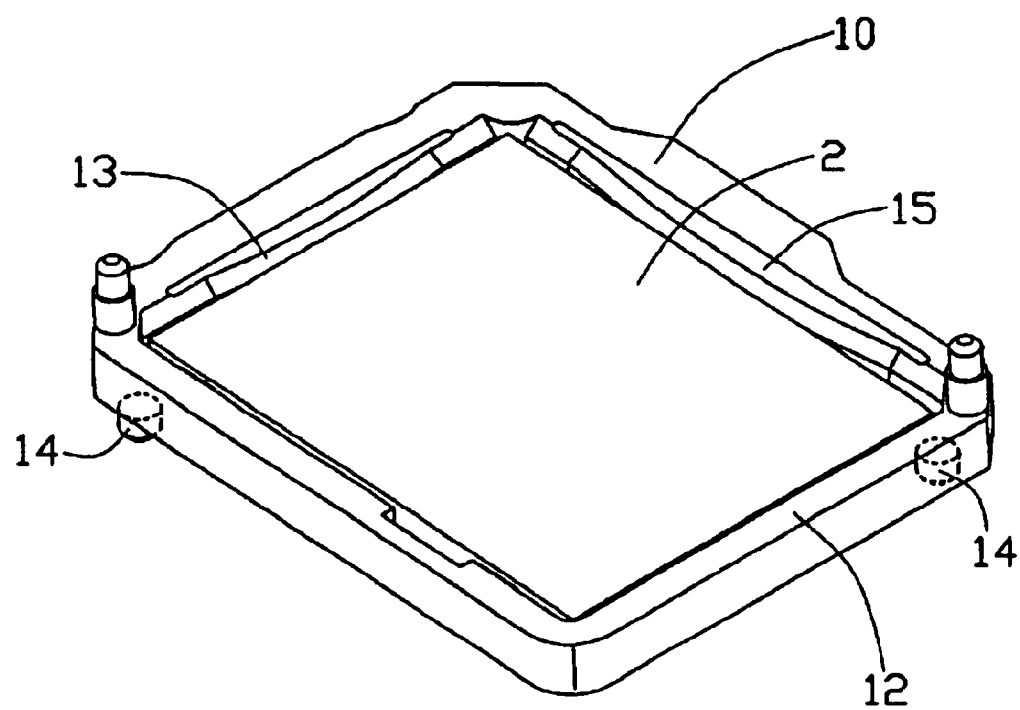
FIG. 2 is an assembled view of FIG. 1.
Figure 3:
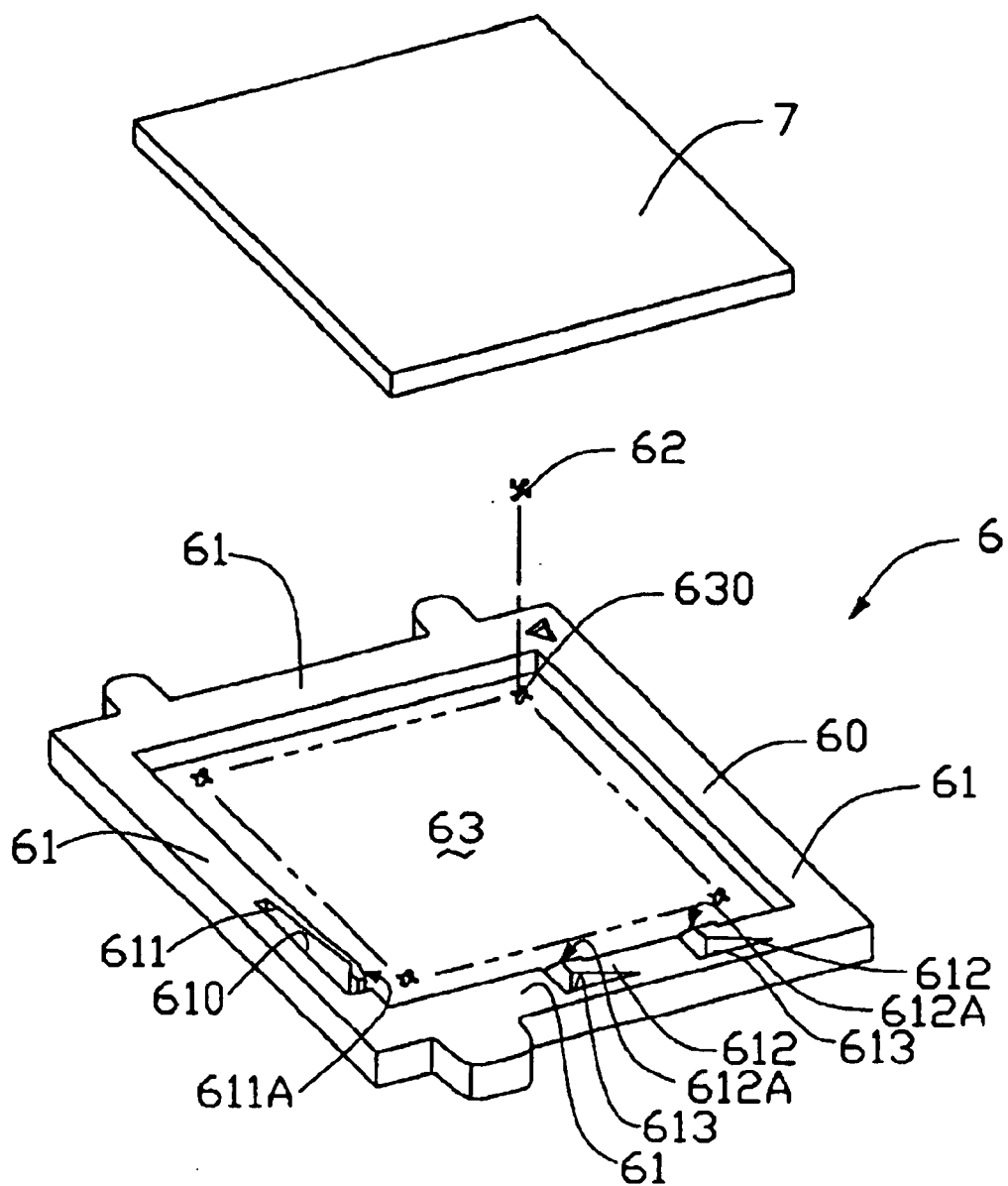
FIG. 3 is a simplified, exploded, isometric view of a conventional electrical connector, together with an LGA chip ready to be mounted in a base of the connector.

Referring to FIGS. 1 and 2, during insertion of the LGA chip 2 into the base 100 of the housing 10, corresponding lateral sides (not labeled) of the LGA chip 2 press the arcuate portions 132 of the resilient beams 13. With the incline surfaces 131 of the arcuate portions 131 guiding, the resilient beams 13 resiliently deform in their respective spaces 15 and generate required resilient force, thereby cooperatively securing the LGA chip 2 in the base 100 to electrically connect with the terminals 11.

Because the resilient beam 13 connects with the sidewall 12 at two end portions, when the resilient beam 13 resiliently deforms and generate resilient force, a proportion of the force is borne by the two connecting portions 134 of the beam 13. Thus the crack or damage of the resilient beam 13 is minimized and the reliably electrical engagement between the terminals 11 and the leads of the LGA chip 2 is attained.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. An electrical connector for connecting an electronic package with a circuit substrate, the electrical connector comprising:

an insulative housing having a base and sidewalls extending upwardly from the base, the base and the sidewalls cooperatively defining a central cavity for receiving the electronic package therein, the base defining a generally rectangular array of passageways, at least one of the sidewalls defining a resilient beam, the resilient beam connecting with an inner portion of the sidewall at two positions, and an arcuate portion defined at a middle thereof, the arcuate portion located in a middle of the sidewall, a space formed between the resilient beam and the one sidewall thereby the resilient beam deforming in the space; and a plurality of conductive terminals received in corresponding passageways for engaging with the electronic package and the circuit substrate.

2. The electrical connector as claimed in claim 1, wherein the electrical connector is an LGA socket and the electronic package is an LGA chip.

3. The electrical connector as claimed in claim 1, wherein the arcuate portion defines an inclined surface generally projecting downwardly toward the space.

4. The electrical connector as claimed in claim 3, wherein two alignment posts are formed at a bottom free of the housing.

5. An electrical connector assembly comprising:

an insulative housing assembly defining a plurality of side walls commonly forming a cavity therein;

a plurality of contacts disposed in the housing with contacting portions extending upwardly into the cavity;

at least one resilient arm disposed in an inner side of one of said side walls, said resilient arm being curved with a middle portion invading portion cavity more than other portions thereof, said curved middle portion located on a middle of said side wall; and an electronic package located in said cavity to mechanically and electrically engage the contact portions, with thereof one side edge engaged with said middle portion; wherein said resilient arm experiences an even force arrangement on two sides of said middle portion.

6. The electrical connector assembly as claimed in claim 5, wherein said resilient arm defines two opposite supports on the housing and by two sides of the middle portion.

7. The electrical connector assembly as claimed in claim 6, wherein the middle portion experiences more deflection than said other portions.

8. The electrical connector assembly as claimed in claim 7, wherein said resilient arm extends along the inner side of said one of the side walls with a distance being similar to while little smaller than a full length of said corresponding side wall.

9. An electrical connector assembly comprising:

an insulative housing assembly defining a plurality of side walls commonly forming a cavity therein;

a plurality of contacts disposed in the housing with contacting portions extending upwardly into the cavity;

at least one curved resilient arm disposed in an inner side of one of said side walls; and an electronic package located in said cavity to mechanically and electrically engage the contact portions, with thereof one side edge engaged with said curved resilient arm; wherein said resilient arm defines two opposite end sections supported on the housing, and said resilient arm extents along the inner side of said one of the side walls with a distance being similar to while little smaller than a full length of said corresponding side wall.

10. The electrical connector assembly as claimed in claim 9, wherein the resilient arm defines an arcuate portion located on a middle of the side wall.

* * * * *